(12) United States Patent
Imakita et al.

(10) Patent No.: US 12,387,922 B2
(45) Date of Patent: Aug. 12, 2025

(54) FILM FORMING APPARATUS, PROCESSING CONDITION DETERMINATION METHOD, AND FILM FORMING METHOD

(71) Applicant: Tokyo Electron Limited, Tokyo (JP)

(72) Inventors: Kenichi Imakita, Albany, NY (US); Hiroaki Chihaya, Nirasaki (JP); Toru Kitada, Nirasaki (JP); Atsushi Gomi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 465 days.

(21) Appl. No.: 17/843,076

(22) Filed: Jun. 17, 2022

(65) Prior Publication Data
US 2022/0415634 A1 Dec. 29, 2022

(30) Foreign Application Priority Data
Jun. 25, 2021 (JP) .................. 2021-105496

(51) Int. Cl.
| | |
|---|---|
| *H01J 37/34* | (2006.01) |
| *C23C 14/35* | (2006.01) |
| *C23C 14/54* | (2006.01) |
| *H01J 37/32* | (2006.01) |
| *H10N 50/01* | (2023.01) |

(52) U.S. Cl.
CPC .......... *H01J 37/3455* (2013.01); *C23C 14/35* (2013.01); *C23C 14/54* (2013.01); *H01J 37/32715* (2013.01); *H01J 37/3405* (2013.01); *H01J 37/3435* (2013.01);
(Continued)

(58) Field of Classification Search
None
See application file for complete search history.

(56) References Cited

U.S. PATENT DOCUMENTS

| | | | | | |
|---|---|---|---|---|---|
| 4,407,713 | A | * | 10/1983 | Zega .................. | H01J 37/3405 204/192.12 |
| 2005/0236267 | A1 | * | 10/2005 | Rich .................. | H01J 37/3455 204/192.12 |

(Continued)

FOREIGN PATENT DOCUMENTS

| | | |
|---|---|---|
| JP | 2005-054251 A | 3/2005 |
| WO | 2009157341 A1 | 12/2009 |

*Primary Examiner* — Jason Berman
(74) *Attorney, Agent, or Firm* — Nath, Goldberg & Meyer; Jerald L. Meyer; Tanya E. Harkins

(57) ABSTRACT

A film forming apparatus for forming a film by magnetron sputtering includes a substrate support supporting the substrate, a holder holding a target for emitting sputtered particles, a magnet unit having a magnet, first and second movement mechanisms configured to periodically move the substrate support and the magnet unit, respectively, and a controller. The controller is configured to control the first movement mechanism and the second movement mechanism so that a phase in a periodic movement of the substrate support remains the same at a start of film formation and at an end of film formation, a phase in a periodic movement of the magnet unit remains the same at a start of film formation and at an end of film formation, and the phase in the periodic movement of the substrate support and the phase in the periodic movement of the magnet unit do not match during film formation.

9 Claims, 5 Drawing Sheets

(52) U.S. Cl.
CPC ........ *H10N 50/01* (2023.02); *H01J 2237/202* (2013.01); *H01J 2237/332* (2013.01)

(56) References Cited

U.S. PATENT DOCUMENTS

| | | | |
|---|---|---|---|
| 2007/0017799 A1* | 1/2007 | Guo | H01J 37/3473 204/192.1 |
| 2015/0136596 A1* | 5/2015 | Nakamura | H01J 37/3405 204/298.16 |
| 2020/0332412 A1* | 10/2020 | Xiao | C23C 14/542 |

* cited by examiner

FILM FORMING APPARATUS, PROCESSING CONDITION DETERMINATION METHOD, AND FILM FORMING METHOD

CROSS-REFERENCE TO RELATED APPLICATION

This application is based upon and claims the benefit of priority from Japanese Patent Application No. 2021-105496, filed on Jun. 25, 2021, the entire contents of which are incorporated herein by reference.

TECHNICAL FIELD

The present disclosure relates to a film forming apparatus, a processing condition determination method, and a film forming method.

BACKGROUND

In the related art, there is known a sputtering apparatus that includes a sputtering cathode for supporting a target and a substrate support holder for supporting a substrate. In this sputtering apparatus, the sputtering cathode and the substrate support holder are provided so that, among the perpendicular lines perpendicular to the plane including the film-formed surface of the substrate, the perpendicular line passing through the center point of the target and the perpendicular line passing through the center point of the substrate do not coincide with each other. The substrate support holder is rotatable about a rotation axis perpendicular to the film-formed surface of the substrate. Further, the sputtering apparatus includes a controller configured to control the rotation speed V (rps) of the substrate support holder so as to satisfy VT=N+α by inputting the values of the total integer rotation speed N, the fractional rotation speed α, and the deposition time T so that, when the total rotation speed of the substrate support holder at the deposition time T (seconds) of sputtered particles on the film-formed surface of the substrate is X, X=N+α, where N is the total integer rotation speed which is a positive integer, and α is the fractional rotation speed which is a positive pure decimal number).

PRIOR ART DOCUMENT

Patent Document

Patent Document 1: PCT International Publication No. 2009/157341

SUMMARY

According to one embodiment of the present disclosure, there is provided a film forming apparatus for forming a film on a substrate by magnetron sputtering, including: a substrate support configured to support the substrate; a holder configured to hold a target for emitting sputtered particles so that the target faces the substrate support; a magnet unit provided on a side of the holder opposite to the substrate support and having a magnet; a first movement mechanism configured to periodically move the substrate support; a second movement mechanism configured to periodically move the magnet unit with respect to the target held by the holder; and a controller, wherein the controller is configured to control the first movement mechanism and the second movement mechanism so that a phase in a periodic movement of the substrate support remains the same at a start of film formation and at an end of film formation, a phase in a periodic movement of the magnet unit remains the same at a start of film formation and at an end of film formation, and the phase in the periodic movement of the substrate support and the phase in the periodic movement of the magnet unit do not match during film formation.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
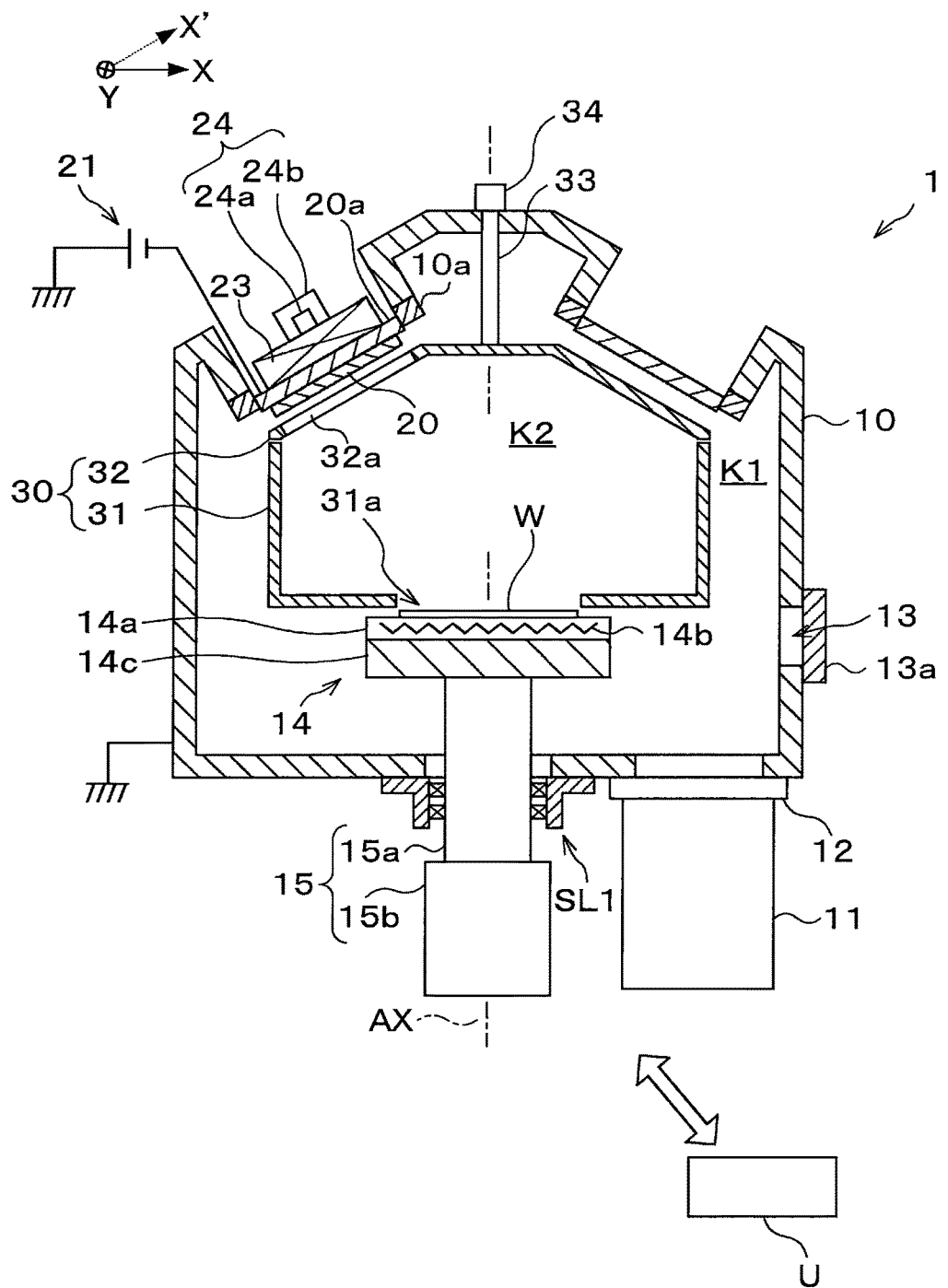
FIG. 1 is a vertical cross-sectional view showing an outline of a configuration of a film forming apparatus according to the present embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a manufacturing process of a semiconductor device or the like, a film forming process for forming a desired film of a metal or the like is performed on a substrate such as a semiconductor wafer (hereinafter referred to as a "wafer") or the like. For example, sputtering is used for the film forming process.

The film forming apparatus for forming a film by sputtering includes, for example, a substrate support configured to support a substrate, and a cathode configured to hold a target on the front surface thereof so that the target for emitting sputtered particles faces the substrate support.

When the target is held by the cathode so as to be non-parallel to the substrate, the substrate support may be configured to be rotatable, and the substrate supported by the substrate support may be rotated during film formation. This is to prevent the thickness of the film formed on the substrate by sputtering from varying on the surface of the substrate. In the related art, the total rotation of the substrate support holder is set to a predetermined value based on the deposition time of the sputtered particles and the rotation speed of the substrate support holder, thereby securing uniformity of the deposition amount, i.e., the film thickness.

Further, when magnetron sputtering is adopted as sputtering, in order to effectively utilize the entire target, a magnet unit including a magnet and having a smaller size than the target may be provided, and the magnet unit may be configured to be swingable or rotatable with respect to the cathode. However, in the case of such magnetron sputtering, the uniformity of the film thickness may not be sufficiently secured only by adjusting the total rotation speed of the substrate support as in the related art.

Therefore, the technique according to the present disclosure improves the in-plane film thickness uniformity when forming a film by magnetron sputtering.

Hereinafter, the film forming apparatus, the processing condition determination method and the film forming method according to the present embodiment will be described with reference to the drawings. In the subject specification and the drawings, elements having substantially the same functional configuration are designated by the same reference numerals, and the duplicate description thereof will be omitted.

<Film Forming Apparatus>

Figure 2:
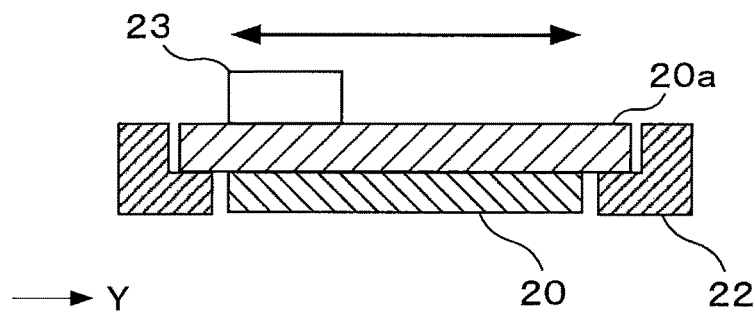
FIG. 2 is a diagram for explaining a configuration around a cathode.
Figure 3:
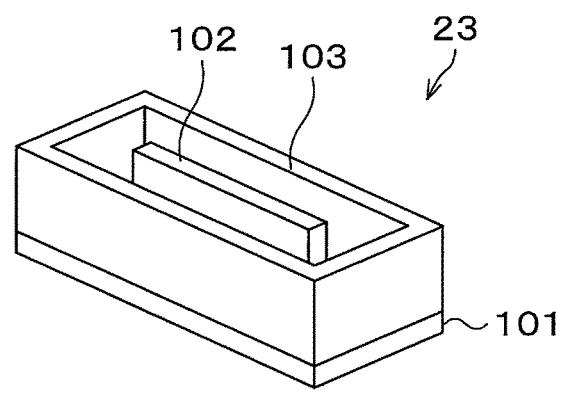
FIG. 3 is a perspective view of a magnet unit.

FIG. 1 is a vertical cross-sectional view showing an outline of a configuration of the film forming apparatus 1 according to the present embodiment. FIG. 2 is a diagram for explaining a configuration around a cathode described later. FIG. 3 is a perspective view of a magnet unit described later.

The film forming apparatus 1 shown in FIG. 1 is configured to form a film on a substrate by magnetron sputtering. Specifically, a film (e.g., Ta film) for a magnetic tunnel junction (MTJ) element is formed on a wafer W as a substrate by magnetron sputtering.

The film forming apparatus 1 includes a processing container 10. The processing container 10 is configured to be depressurized and to accommodate the wafer W. The processing container 10 is formed of, for example, aluminum and is connected to a ground potential. An exhaust device 11 for reducing the pressure in the space K1 inside the processing container 10 is connected to the bottom of the processing container 10. The exhaust device 11 includes a vacuum pump (not shown) and the like, and is connected to the processing container 10 via, for example, an APC valve 12.

Further, a wafer loading/unloading port 13 is formed on one side wall (the X-direction positive side wall in the figure) of the processing container 10, and a gate valve 13a for opening and closing the loading/unloading port 13 is provided at the loading/unloading port 13.

In the processing container 10, a stage 14 as a substrate support for supporting the wafer W is provided. Specifically, the wafer W is horizontally mounted on the stage 14 so as to face the processing space K2 defined by the shield part 30 described later. The stage 14 supports the wafer W thus mounted. The stage 14 includes an electrostatic chuck 14a, a heater 14b, and a base portion 14c.

The electrostatic chuck 14a includes, for example, a dielectric film and an electrode provided as an inner layer of the dielectric film. The electrostatic chuck 14a is provided on the base portion 14c. A DC power supply (not shown) is connected to the electrode of the electrostatic chuck 14a. The wafer W mounted on the electrostatic chuck 14a is attracted and held by the electrostatic chuck 14a by the electrostatic attraction force generated by applying a DC voltage from the DC power supply to the electrode.

The heater 14b is configured to heat the wafer W supported by the stage 14. The heater 14b heats the wafer W supported by the stage (specifically, the electrostatic chuck 14a) by heating the stage 14 (specifically, the electrostatic chuck 14a). For example, a resistance heating type heater may be used as the heater 14b. In addition, the heater 14b is provided on, for example, the electrostatic chuck 14a.

The base portion 14c is formed in a disk shape using, for example, aluminum. Depending on the type of the heater 14b and the like, the heater 14b may be provided on the base portion 14c.

The stage 14 may be provided with a cooling mechanism for cooling the wafer W mounted on the stage 14.

Further, the stage 14 is connected to a rotation/movement mechanism 15 as a first movement mechanism. The rotation/movement mechanism 15 periodically moves the stage 14. In the present embodiment, the rotation/movement mechanism 15 rotates and moves the stage 14. Specifically, the rotation/movement mechanism 15 rotates the stage 14 about an axis AX passing through the center of the upper surface of the stage 14 perpendicularly to the upper surface of the stage 14. Further, the rotation/movement mechanism 15 can move the stage 14 up and down. The rotation/movement mechanism 15 includes, for example, a support shaft 15a and a drive part 15b.

For example, the support shaft 15a extends in the vertical direction so as to penetrate the bottom wall of the processing container 10. A sealing member SL1 is provided between the support shaft 15a and the bottom wall of the processing container 10. The sealing member SL1 is a member that seals the space between the bottom wall of the processing container 10 and the support shaft 15a such that the support shaft 15a can rotate and move up and down. For example, the sealing member SL1 is a magnetic fluid seal. The upper end of the support shaft 15a is connected to the center of the lower surface of the stage 14, and the lower end thereof is connected to the drive part 15b.

The drive part 15b includes a drive source such as a motor or the like and generates a drive force for rotating and moving the support shaft 15a up and down. As the support shaft 15a is rotated about the axis AX by the drive force generated by the drive part 15b, the stage 14 is rotated about the axis AX. As the support shaft 15a is moved up and down by the drive force generated by the drive part 15b, the stage 14 is moved up and down.

The number of rotations per unit time Vw of the stage 14 (hereinafter referred to as the rotation speed of the stage 14) rotated by the rotation/movement mechanism 15 is, for example, 60 to 120 rotations per minute (i.e., 60 rpm to 120 rpm). If the rotation speed Vw of the stage 14 is less than 60 rpm, the total number of rotations of the wafer W required to make the film thickness distribution uniform cannot be obtained. Further, if the rotation speed Vw of the stage 14 is larger than 120 rpm, the load on the drive part 15b or the like of the rotation/movement mechanism 15 becomes large, and the lifespan of the rotation/movement mechanism 15 becomes short.

The rotation/movement mechanism 15 (specifically, the drive part 15b) is controlled by a controller U described later.

Obliquely above the stage 14, a holder 20a made of a conductive material is provided to hold, for example, a target 20 made of Ta for emitting sputtered particles. The holder 20a holds the target 20 so that the target 20 is located in the processing container 10. The holder 20a is attached to the ceiling of the processing container 10. A through-hole is formed at the attachment position of the holder 20a in the processing container 10. Further, an insulating member 10a is provided on the inner wall surface of the processing container 10 so as to surround the through-hole. The holder 20a is attached to the processing container 10 via the insulating member 10a so as to close the through-hole.

The holder 20a holds the target 20 on the front surface thereof so that the target 20 faces the stage 14. Specifically, the holder 20a holds the target 20 so that the target 20 faces the stage 14 and is tilted with respect to the upper surface of the stage 14, i.e., the surface of the wafer W mounted on the upper surface of the stage 14.

The target 20 is formed, for example, in a rectangular shape in a plan view. When the target 20 is held in the holder 20a, the long axis of the target 20 extends in the apparatus depth direction (Y direction in FIG. 1). The length of the target 20 in the apparatus depth direction (Y direction in FIG. 1) is larger than, for example, the diameter of the wafer W which is a film-forming target. When the diameter of the wafer W which is a film-forming target is 300 mm, the length of the target 20 in the apparatus depth direction (Y direction in FIG. 1) is, for example, 400 to 500 mm. The length of the target 20 in the direction (X' direction in FIG. 1) orthogonal to the apparatus depth direction (Y direction in FIG. 1) is, for example, 150 to 200 mm.

Further, a power supply 21 is connected to the holder 20a, and a negative DC voltage is applied from the power supply 21 to the holder 20a. An AC voltage may be applied instead of the negative DC voltage. Further, as shown in FIG. 2, the holder 20a is provided with a shield 22 for the purpose of preventing other portions from being contaminated by sputtered particles generated from the target 20 held by the holder 20a. For example, the shield 22 is provided so as to cover the outer periphery of the target 20 held by the holder 20a.

Further, a magnet unit 23 is provided at a position on the side of the holder 20a opposite to the stage 14, i.e., on the back side of the holder 20a and outside the processing container 10. The magnet unit 23 is configured to form a magnetic field that leaks to the front side of the target 20 held by the holder 20a. For example, as shown in FIG. 3, a rectangular parallelepiped central magnet 102 and an outer peripheral magnet 103 having a rectangular ring shape in a plan view are arranged on a flat plate-shaped yoke 101. The central magnet 102 is provided along the longitudinal direction of the yoke 101, and the outer peripheral magnet 103 is provided so as to surround the four sides of the central magnet 102 in a plan view. Further, the central magnet 102 and the outer peripheral magnet 103 are magnetized opposite to each other in the direction perpendicular to the central magnet side surface of the yoke 101.

As shown in FIG. 1, the magnet unit 23 is connected to a movement mechanism 24 as a second movement mechanism. The movement mechanism 24 is configured to periodically move the magnet unit 23. In the present embodiment, the movement mechanism 24 swings or reciprocates the magnet unit 23 along the back surface of the holder 20a in the apparatus depth direction (Y direction in FIGS. 1 and 3). In other words, the movement mechanism 24 moves the magnet unit 23 along the back surface of the holder 20a in the positive apparatus depth direction (positive Y direction in FIGS. 1 and 3) and in the negative apparatus depth direction (negative Y direction in FIGS. 1 and 3).

The movement mechanism 24 includes, for example, a rail 24a extending along the apparatus depth direction (Y direction in FIGS. 1 and 3), and a drive part 24b including a drive source such as a motor or the like. By the drive force generated by the drive part 24b, the magnet unit 23 is moved along the rail 24a in the apparatus depth direction (Y direction in FIGS. 1 and 3). More specifically, by the drive force generated by the drive part 24b, the magnet unit 23 is moved to reciprocate between one end of the target 20 (the negative side end in the Y direction in FIGS. 1 and 3) and the other end of the target 20 (the positive side end in the Y direction in FIGS. 1 and 3). This prevents the target 20 from being locally consumed and makes it possible to utilize almost the entire target 20.

In counting the "number of swings" of the magnet unit 23 in the subject specification, for example, the movement of the target 20 from the negative end in the apparatus depth direction to the positive end in the apparatus depth direction is counted as one swing, and the movement of the target 20 from the positive end in the apparatus depth direction to the negative end in the apparatus depth direction is counted as one swing. Accordingly, when the magnet unit 23 reciprocates once, the "number of swings" of the magnet unit 23 is two.

The number of swings per unit time of the magnet unit 23 swung by the movement mechanism 24 (hereinafter referred to as the swing speed of the magnet unit 23) is, for example, 30 to 120 times/minute. If the swing speed Vm of the magnet unit 23 is less than 30 times/minute, it is not possible to sufficiently prevent the target 20 from being locally consumed. Further, if the swing speed Vm of the magnet unit 23 is larger than 120 times/minute, the load on the drive part 24b or the like of the movement mechanism 24 becomes large and the lifespan of the movement mechanism 24 becomes short.

The movement mechanism 24 (specifically, the drive part 24b) is controlled by the controller U described later.

Further, the film forming apparatus 1 includes a shield part 30 that forms a processing space K2 in the processing container 10. The shield part 30 is provided in the processing container 10.

The shield part 30 includes a first shield member 31 and a second shield member 32. The first shield member 31 and the second shield member 32 are formed of, for example, aluminum.

The first shield member 31 is a pot-shaped member having an open upper portion. The first shield member 31 has a hole 31a formed on the bottom surface thereof to expose the processing space K2 to the wafer W mounted on the stage 14. The first shield member 31 is supported in the processing container 10 via, for example, a support member (not shown).

The second shield member 32 is a lid member that closes the upper opening of the first shield member 31 and is formed so that the central portion in a plan view protrudes upward. The second shield member 32 has an opening 32a. Sputtered particles from the target 20 held by the holder 20a are supplied to the processing space K2 through the opening 32a.

Further, one end of a rotary shaft 33 is connected to the central portion of the second shield member 32. The central axis of the rotary shaft 33 substantially coincides with the axis AX. The rotary shaft 33 extends to the outside of the processing container 10, and the other end of the rotary shaft 33 is connected to the rotation mechanism 34. The rotation mechanism 34 rotates the rotary shaft 33 about the axis AX. The rotation mechanism 34 includes a drive part (not shown) including a drive source such as a motor or the like that generates a drive force for rotating the rotary shaft 33.

By rotating the second shield member 32, the opening 32a of the second shield member 32 can be caused to face the target 20 held by the holder 20a, or the portion of the second shield member 32 where the opening 32a is not formed can be caused to face the target 20.

Further, the film forming apparatus 1 includes a gas supply (not shown) for supplying a gas into the processing container 10. The gas supply includes, for example, a gas source, a flow rate controller such as a mass flow controller or the like, and a gas introduction part. The gas source stores a gas (e.g., Ar gas) excited in the processing container 10. The gas source is connected to the gas introduction part via the flow controller. The gas introduction part is a member that introduces the gas from the gas source into the processing container 10.

When the gas is supplied from the gas supply and the electric power is supplied to the target 20 by the power supply 21, the gas supplied in the processing container 10 is excited. Further, the magnet unit 23 generates a magnetic field in the vicinity of the front surface of the target 20, and plasma is concentrated in the vicinity of the front surface of the target 20. Then, when the positive ions in the plasma collide with the target 20, the substance constituting the target 20 is emitted from the target 20 as sputtered particles. As a result, a desired film is formed on the wafer W.

As shown in FIG. 1, the film forming apparatus 1 further includes the controller U. The controller U is composed of, for example, a computer equipped with a CPU, a memory, and the like, and includes a program storage part (not shown). The program storage part stores programs for controlling the drive part 15b, the power supply 21, the drive part 24b, and the like to realize the below-described film forming process in the film forming apparatus 1. Further, the program storage part stores a program for determining processing conditions for film formation. The above programs may be recorded on a computer-readable storage medium and may be installed on the controller U from the storage medium. The storage medium may be transitory or non-transitory. In addition, a part or all of the programs may be implemented by dedicated hardware (circuit board).

<Total Number of Rotations Nw of Stage 14 and Total Number of Swings Nm of Magnet Unit 23 During Film Formation>

When the target 20 is tilted with respect to the upper surface of the stage 14, i.e., the surface of the wafer W mounted on the upper surface of the stage 14 as described above, the film thickness when a film is formed on the wafer W may be non-uniform in the plane of the wafer W. This is because the distance to the target 20 is different for each region on the surface of the wafer W. In order to eliminate the in-plane non-uniformity of the film thickness, the stage 14 on which the wafer W is mounted is rotated during film formation. However, when the magnet unit 23 is used, even if the stage 14 is rotated, the in-plane uniformity of the film thickness may be insufficient for the following reasons.

Figure 4:
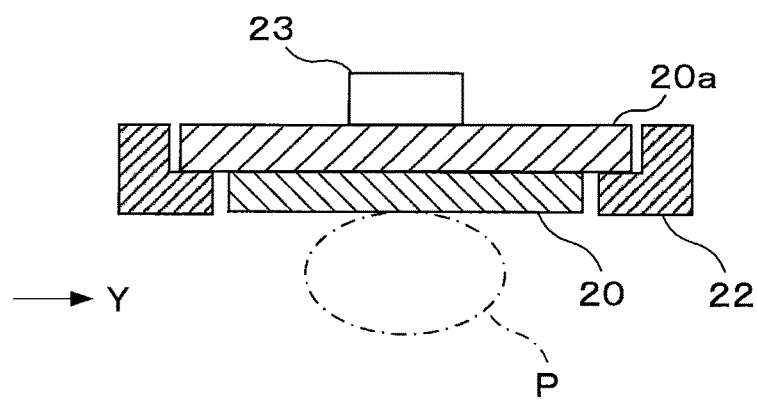
FIG. 4 is a diagram showing a relationship between a position of the magnet unit with respect to a target and an area of a region of the target exposed to plasma.
Figure 5:
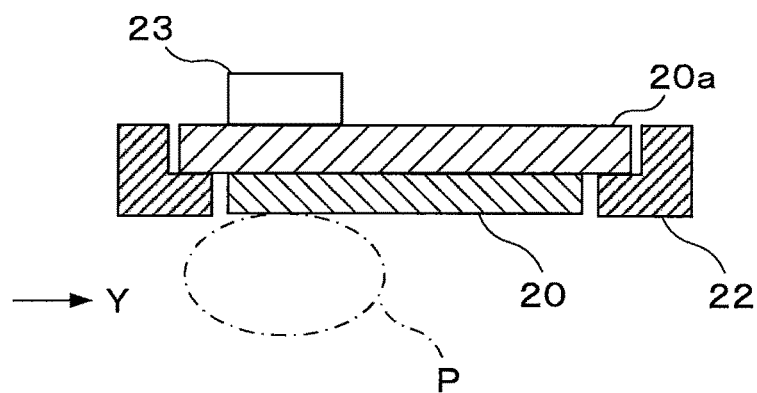
FIG. 5 is a diagram showing the relationship between the position of the magnet unit with respect to the target and the area of the region of the target exposed to plasma.

That is, in order to effectively utilize the target 20, the magnet unit 23 is configured to swing with respect to the target 20 so that the magnetic field formed by the magnet unit 23 covers the entire width of the target 20. Further, the size of the region of the target 20 exposed to plasma P differs depending on whether the magnet unit 23 is located at a portion facing the center of the target 20 in the swing direction as shown in FIG. 4, or at a portion facing the end of the target 20 in the swing direction as shown in FIG. 5. Therefore, the number of sputtered particles emitted from the target 20 also varies, and the deposition amount of thin film deposited on the wafer W per unit time (i.e., the deposition rate of the thin film on the wafer W) also varies. Then, for example, if the magnet unit 23 is located at the center of the target 20 a plurality of times during film formation, depending on the relationship between the rotation speed Vw of the stage 14 and the swing speed Vm of the target 20, the orientation (position in the rotation direction) of the wafer W on the stage 14 when the magnet unit 23 is located at the center of the target 20 may be the same each time. In this case, even if the stage 14 is rotated during the film formation, the distribution of the film thickness in the plane of the wafer W may be biased.

In view of this point and the like, in the present embodiment, the controller U controls the drive part 15b and the drive part 24b so as to satisfy the following conditions (1) to (3) at the time of film formation.

(1) The phase in the rotational movement of the stage 14 (specifically, the position in the rotational direction of the stage 14, i.e., the orientation of the stage 14) remains the same at the start of film formation and at the end of film formation.

(2) The phase of the swing of the magnet unit 23 remains the same at the start of film formation and at the end of film formation.

(3) The phase in the rotational movement of the stage 14 and the phase in the swing of the magnet unit 23 do not match during film formation.

Satisfying the above condition (1) means that the total number of rotations Nw of the stage 14 during film formation becomes a natural number. As a result, the time length at which each region of the surface of the wafer W on the stage 14 is closest to the target 20 can be made equal for the respective regions. Thus, the thickness of the formed film can be made uniform in the wafer plane.

Satisfying the above condition (2) means that the total number of swings Nm of the magnet unit 23 during film formation becomes a natural number. As a result, the consumption of the target 20 can be made uniform in the plane of the target 20.

Figure 6:
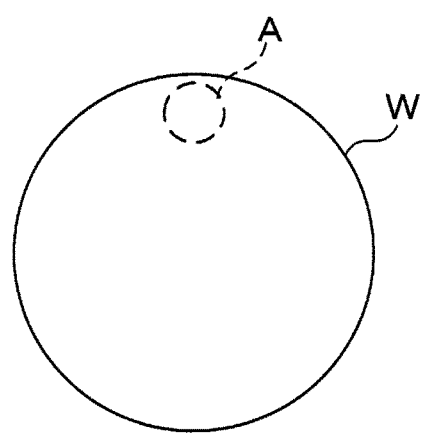
FIG. 6 is a diagram for explaining a method of determining a total number of rotations of the stage and a total number of swings of the magnet unit during film formation.
Figure 7:
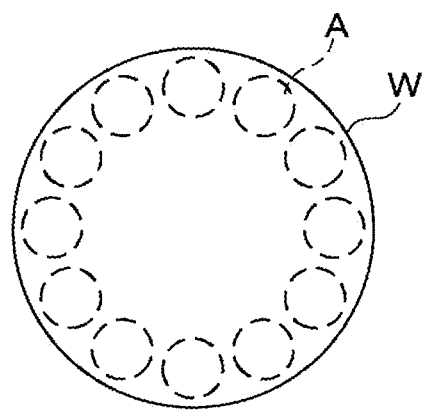
FIG. 7 is a diagram for explaining a method of determining the total number of rotations of the stage and the total number of swings of the magnet unit during film formation.

Satisfying the above conditions (1) to (3) means that the total number of swings Nm is not an integer multiple of the total number of rotations Nw, and the total number of rotations Nw is not an integer multiple of the total number of swings Nm. As a result, when the magnet unit 23 is located at the center of the target 20 a plurality of times during film formation, the orientation of the wafer W on the stage 14 at the time when the magnet unit 23 is located at the center of the target 20 can be changed each time. In other words, the position A where the thin film is mainly deposited when the magnet unit 23 is located at the center of the target 20 is not one position in the plane of the wafer W as shown in FIG. 6, but may be multiple positions (e.g., every 30°) in the plane of the wafer W as shown in FIG. 7. Therefore, it is possible to suppress the occurrence of local film thickness unevenness, and it is possible to improve the uniformity of the film thickness in the plane of the wafer W.

<Processing Condition Determination Method>

Next, an example of a method for determining the processing conditions for film formation by magnetron sputtering using the film forming apparatus 1, specifically, an example of a method for determining the processing conditions for the rotation of the stage 14 and the swing of the magnet unit 23 during film formation, will be described.

In this determination method, for example, the controller U determines the processing conditions for the rotation of the stage 14 and the swing of the magnet unit 23 during film formation so that the above conditions (1) to (3) are satisfied. Specifically, the processing conditions may be determined as follows.

(Step S1: Determination of Film Formation Time)

For example, first, when a target film thickness value is inputted to the controller U by an operator or the like via an input device such as a keyboard or the like, the controller U determines the film formation time T, i.e., the deposition time T, from the target film thickness value and the film formation rate by the film forming apparatus 1, i.e., the deposition rate of a thin film acquired in advance.

(Step S2: Determination of Total Number of Rotations Nw and Rotation Speed Vw of Stage 14)

Next, the controller U determines the total number of rotations Nw of the stage 14 and the rotation speed Vw of the stage 14 during film formation. Specifically, the controller U determines the rotation speed Vw of the stage 14 from a range of 60 rpm to 120 rpm based on the film formation time T determined in step S1, so that the total number of rotations Nw of the stage 14 during film formation becomes a natural number.

(Step S3: Determination of Total Number of Swings Nm and Swing Speed Vm of Magnet Unit 23)

Then, the controller U determines the total number of swings Nm of the magnet unit 23 and the swing speed Vm of the magnet unit 23 during film formation. Specifically, the swing speed Vm of the magnet unit 23 is determined from a range of 30 times/minute to 120 times/minute based on the film formation time T determined in step S1, so that the total number of swings Nm of the magnet unit 23 during film formation becomes a natural number satisfying the above (3). In other words, the controller U determines the swing speed Vm of the magnet unit 23 from the range of 30 times/minute to 120 times/minute so that Nm=Nw±n (where n is an arbitrary natural number) is satisfied and Nm/Nw and Nw/Nm are not integers.

If, in step S2 and step S3, there are multiple rotation speeds Vw of the stage 14, which satisfy that: (1) Nm=Nw±n (where Nm and Nw are natural numbers, and n is an arbitrary natural number); (2) Nm/Nw and Nw/Nm are not integers; (3) the rotation speed Vw of the stage 14 is in the range of 60 rpm to 120 rpm; and (4) the swing speed Vm of the magnet unit 23 is in the range of 30 times/minute to 120 times/minute, the highest rotation speed Vw is selected. This is to suppress variations in film formation. Further, if there are multiple swing speeds Vm of the magnet unit 23 with respect to the determined/selected rotation speed Vw of the stage 14, the largest swing speed Vm is similarly selected.

<Film Forming Process>

Next, an example of the film forming process using the film forming apparatus 1 will be described. The following process is performed under the control of the controller U.

(S11: Loading)

First, the wafer W is loaded into the processing container 10. Specifically, the gate valve 13a is opened, and the transfer mechanism (not shown) holding the wafer W is inserted into the processing container 10 from the vacuum atmosphere transfer chamber (not shown) adjacent to the processing container 10 adjusted to a desired pressure by the exhaust device 11 via the loading/unloading port 13. The pressure in the processing container 10 and in the transfer chamber at this time is, for example, $10^{-7}$ Torr to $10^{-9}$ Torr. Next, the wafer W is delivered from the transfer mechanism onto the raised support pins (not shown). Thereafter, the transfer mechanism is withdrawn from the processing container 10, and the gate valve 13a is closed. At the same time, the support pins are lowered. The wafer W is placed on the stage 14 and is attracted and held by the electrostatic attraction force of the electrostatic chuck 14a. Further, the stage 14 is raised, and the wafer W is moved to a position directly under the hole 31a of the shield part 30.

(S12: Rotation of Stage 14)

Subsequently, the rotation/movement mechanism 15 is controlled so that the stage 14 is rotated at the rotation speed Vw determined in step S2 or the like described above.

(Step S13: Swing of Magnet Unit 23)

Further, the movement mechanism 24 is controlled so that the magnet unit 23 swings at the swing speed Vm determined in step S3 or the like described above.

(Step S14: Film Formation)

Subsequently, by magnetron sputtering, a desired film is formed on the wafer W for the film formation time T determined in step S1 described above. Specifically, for example, an Ar gas is supplied from the gas supply (not shown) into the processing container 10. Further, electric power is supplied from the power supply 21 to the target 20. The Ar gas in the processing container 10 is ionized by the electric power supplied from the power supply 21, and the electrons generated by the ionization are drift-moved by the magnetic field (i.e., the leaked magnetic field) formed in front of the target 20 by the magnet unit 23, thereby generating high-density plasma. The surface of the target 20 is sputtered by the Ar ions generated in the plasma, and the sputtered particles are deposited on the wafer W to form a thin film. If the film formation time T determined in step S1 described above elapses after the power supply from the power supply 21 is started, the power supply is stopped, the gas supply from the gas supply (not shown) is also stopped, and the rotation of the stage 14 and the swing of the magnet unit 23 are also stopped.

(Step S15: Unloading)

Thereafter, the wafer W is unloaded from the processing container 10. Specifically, the wafer W is unloaded from the processing container 10 in an operation opposite to the loading operation of step S11. Then, the process returns to the above-mentioned loading step, and a next wafer W on which a film is to be formed is processed in the same manner <Main Effects of the Present Embodiment>

As described above, according to the present embodiment, it is possible to suppress the occurrence of local film thickness unevenness when forming a film by magnetron sputtering, and it is possible to improve uniformity of the film thickness in the plane of the wafer W.

EXAMPLE

Figure 8:
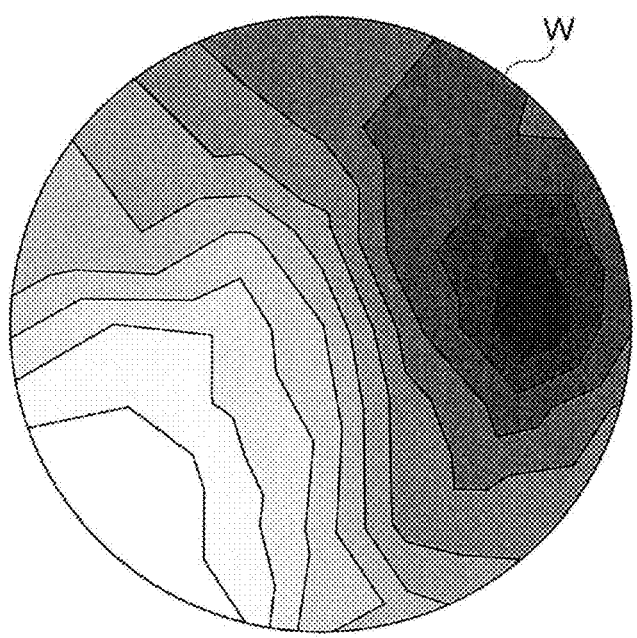
FIG. 8 is a diagram showing a wafer in-plane film thickness distribution in a Comparative Example.
Figure 8:
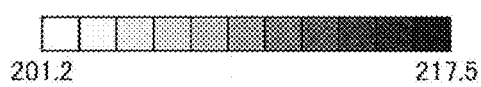
Figure 9:
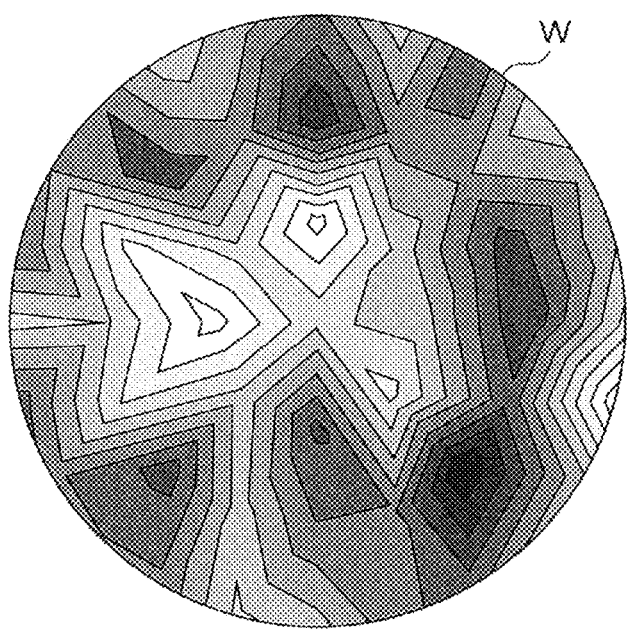
FIG. 9 is a diagram showing a wafer in-plane film thickness distribution in an Example.
Figure 9:
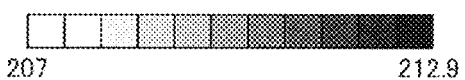

FIGS. 8 and 9 are diagrams showing in-plane film thickness distributions in a Comparative Example and an Example, respectively. In the Comparative Example and the Example, a target 20 made of Ta was used, and film formation was performed by magnetron sputtering with a target film thickness of 1 nm under the condition of a film formation rate of 0.125 nm/s. That is, the film formation time T was set to 8 seconds.

Further, in the Comparative Example and the Example, the total number of rotations Nw of the stage 14 was set to 8 times, and the rotation speed of the stage 14 was set to 60 rpm of (Nw/T)×60 (where Nw is 8 times, and T is 8 seconds).

Then, in the Example, the total number of swings Nm of the magnet unit 23 was set to 9 times of Nm=Nw+1 (where Nw is 8 times) so as to satisfy the condition that both Nm/Nw and Nw/Nm are not integers. During the film formation, the phase in the rotational movement of the stage 14 and the phase in the swing of the magnet unit 23 were prevented from matching. On the other hand, in the Comparative Example, the total number of swings Nm of the magnet unit 23 was set to 8 times of Nm=Nw (where Nw is 8 times) so as not to satisfy the condition that both Nm/Nw and Nw/Nm are not integers. During the film formation, the phase in the rotational movement of the stage 14 and the phase in the swing of the magnet unit 23 were allowed to match.

In the Comparative Example, the phase in the rotational movement of the stage 14 and the phase in the swing of the magnet unit 23 are allowed to match during the film formation. As a result, as shown in FIG. 8, there is a portion where the Ta film is extremely thick. The thickness of the Ta film is non-uniform in the plane of the wafer W. Further, in the Comparative Example, the coefficient of variation (CV) of the film thickness, which is obtained by dividing the standard deviation of the film thickness by the average value of the film thickness, is 2.0%.

On the other hand, in the Example, as shown in FIG. 9, unlike the Comparative Example, there is no portion where the Ta film is extremely thick. Moreover, in the Example, the coefficient of variation of the film thickness is 0.6%.

From the above results, it can be noted that, by using the method of the present disclosure, a thin film having a film thickness distribution with a coefficient of variation of 1% or less can be formed on a wafer W even when the magnetron sputtering is performed while swinging the magnet unit 23.

<Modification>

In the above example, the total number of rotations Nw and the rotation speed Vw of the stage 14 are determined first, and the total number of swings Nm and the swing speed Vm of the magnet unit 23 are determined later. However, the total number of swings Nm and the swing speed Vm of the magnet unit 23 may be determined first, and the total number of rotations Nw and the rotation speed Vw of the stage 14 may be determined later. Specifically, the controller U may first determine the swing speed Vm of the magnet unit 23 from a predetermined range based on the film formation time T so that the total number of swings Nm of the magnet unit 23 becomes a natural number. Then, the controller U may determine the rotation speed Vw of the stage 14 from a predetermined range based on the film formation time T so that the total number of rotations Nw of the stage 14 during film formation becomes a natural number satisfying the above (3).

Further, in the above example, the stage 14 is rotated. However, the mode of periodic movement of the stage 14 is not limited thereto. For example, like the magnet unit 23, the stage 14 may be swung in a predetermined direction such as a horizontal direction or the like. In this case as well, the technique according to the present disclosure may be applied.

Further, in the above example, the magnet unit 23 is caused to swing. However, the mode of periodic movement of the magnet unit 23 is not limited thereto. For example, when the target 20 is circular in a plan view, the magnet unit 23 may be rotated about the central axis of the target 20 along the back surface of the holder 20a. Further, the magnet unit 23 may be moved so as to draw a rectangular locus along the back surface of the holder 20a about the central axis of the target 20. In these cases as well, the technique according to the present disclosure may be applied.

The embodiments disclosed herein should be considered to be exemplary and not limitative in all respects. The above-described embodiments may be omitted, replaced, or modified in various forms without departing from the scope of the appended claims and their gist.

According to the present disclosure in some embodiments, it is possible to improve the in-plane film thickness uniformity when forming a film by magnetron sputtering.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a film on a substrate by magnetron sputtering, comprising:
   a substrate support configured to support the substrate;
   a holder configured to hold a target for emitting sputtered particles so that the target faces the substrate support;
   a magnet unit provided on a side of the holder opposite to the substrate support and having a magnet;
   a first movement mechanism configured to periodically move the substrate support;
   a second movement mechanism configured to periodically move the magnet unit with respect to the target held by the holder; and
   a controller,
   wherein the controller is configured to control the first movement mechanism and the second movement mechanism so that a phase in a periodic movement of the substrate support remains the same at a start of film formation and at an end of film formation, a phase in a periodic movement of the magnet unit remains the same at a start of film formation and at an end of film formation, and the phase in the periodic movement of the substrate support and the phase in the periodic movement of the magnet unit do not match during film formation.

2. The apparatus of claim 1, wherein the controller is configured to control the first movement mechanism and the second movement mechanism so as to satisfy a condition that a total number of movements Nw of the substrate support during film formation and a total number of movements Nm of the magnet unit during film formation are natural numbers different from each other, the total number of movements Nm is not an integer multiple of the total number of movements Nw, and the total number of movements Nw is not an integer multiple of the total number of movements Nm.

3. The apparatus of claim 2, wherein the controller is configured to control the first movement mechanism so that the substrate support is moved at the number of movements per unit time of the substrate support which is determined from a predetermined range based on a time required for film formation so that the total number of movements Nw of the substrate support during film formation becomes a natural number.

4. The apparatus of claim 3, wherein the predetermined range is 60 to 120 times per minute.

5. The apparatus of claim 4, wherein the controller is configured to control the second movement mechanism so that the magnet unit is moved at the number of movements per unit time of the magnet unit which is determined from another predetermined range based on the time required for film formation so that the total number of movements Nw of the magnet unit during film formation becomes a natural number satisfying the condition.

6. The apparatus of claim 5, wherein said another predetermined range is 30 to 120 times per minute.

7. The apparatus of claim 3, wherein the controller is configured to control the second movement mechanism so that the magnet unit is moved at the number of movements per unit time of the magnet unit which is determined from another predetermined range based on the time required for film formation so that the total number of movements Nw of the magnet unit during film formation becomes a natural number satisfying the condition.

8. A processing condition determination method for determining a processing condition at which a film is formed on a substrate by magnetron sputtering using a film forming apparatus,
wherein the film forming apparatus includes a substrate support configured to support the substrate, a holder configured to hold a target for emitting sputtered particles so that the target faces the substrate support, and a magnet unit provided on a side of the holder opposite to the substrate support and having a magnet,
the processing condition determining method comprising:
moving the substrate support periodically during film formation while the magnet unit is periodically moved with respect to the target held by the holder, and
determining the processing condition related to movements of the substrate support and the magnet unit during film formation so that a phase in a periodic movement of the substrate support remains the same at a start of film formation and at an end of film formation, a phase in a periodic movement of the magnet unit remains the same at a start of film formation and at an end of film formation, and the phase in the periodic movement of the substrate support and the phase in the periodic movement of the magnet unit do not match during film formation.

9. A film forming method for forming a film on a substrate by magnetron sputtering using a film forming apparatus,
wherein the film forming apparatus includes a substrate support configured to support the substrate, a holder configured to hold a target for emitting sputtered particles so that the target faces the substrate support, and a magnet unit provided on a side of the holder opposite to the substrate support and having a magnet,
the method comprises forming a film on the substrate by magnetron sputtering by periodically moving the substrate support while periodically moving the magnet unit with respect to the target held by the holder, and
in the forming the film, the substrate support and the magnet unit are moved so that a phase in a periodic movement of the substrate support remains the same at a start of film formation and at an end of film formation, a phase in a periodic movement of the magnet unit remains the same at a start of film formation and at an end of film formation, and the phase in the periodic movement of the substrate support and the phase in the periodic movement of the magnet unit do not match during film formation.

* * * * *